(12) United States Patent
Cesulka

(10) Patent No.: US 6,930,386 B1
(45) Date of Patent: Aug. 16, 2005

(54) SHOCK HARDENED MOUNTING AND COOLING OF A SEMICONDUCTOR DEVICE

(75) Inventor: John L. Cesulka, Fort Walton Beach, FL (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 10/825,796

(22) Filed: Mar. 29, 2004

(51) Int. Cl.$^7$ ............................ H01L 23/34; H05K 7/20
(52) U.S. Cl. ...................... 257/719; 257/718; 361/704; 438/117; 438/122
(58) Field of Search ................................ 257/719, 718, 257/732, 706; 361/704, 690; 438/117, 122

(56) References Cited

U.S. PATENT DOCUMENTS

| | | | |
|---|---|---|---|
| 4,372,211 A | | 2/1983 | Dante |
| 5,648,889 A | * | 7/1997 | Bosli ........................ 361/704 |
| 6,353,537 B2 | | 3/2002 | Egawa |
| 6,380,906 B1 | | 4/2002 | Cesulka |
| 6,453,790 B1 | | 9/2002 | Cesulka et al. |
| 6,456,240 B1 | | 9/2002 | Cesulka |
| 6,535,383 B2 | * | 3/2003 | Terhaar et al. .............. 361/690 |
| 6,625,021 B1 | | 9/2003 | Lofland et al. |

* cited by examiner

*Primary Examiner*—Eddie Lee
*Assistant Examiner*—Douglas W. Owens
(74) *Attorney, Agent, or Firm*—AFMCLO/JAZ; Gerald B. Hollins

(57) ABSTRACT

A semiconductor mounting arrangement inclusive of a heat sink member enabling desirable resistance to physical impact damage to the semiconductor device, the heat sink and the printed circuit board supporting the semiconductor device and the heat sink. The heat sink is fabricated of thermally and electrically conductive metal such as copper and captured by metallic interconnection such as soldering to conductors of the printed circuit board. Efficient thermal and electrical conductivity between semiconductor device and heat sink are achieved also by metallic interconnection such as soldering intermediate the semiconductor device and the heat sink. Desirable semiconductor device performance under extreme electrical and physical force transient loading conditions are disclosed.

23 Claims, 3 Drawing Sheets

SHOCK HARDENED MOUNTING AND COOLING OF A SEMICONDUCTOR DEVICE

RIGHTS OF THE GOVERNMENT

The invention described herein may be manufactured and used by or for the Government of the United States for all governmental purposes without the payment of any royalty.

BACKGROUND OF THE INVENTION

In a series of three issued U.S. Patents we have heretofore described the environment incurred by military munitions devices during their ballistic termination encounter with a target, particularly a hardened target. We have also discussed in these patents the frequent need to study events attending this terminal encounter from of course a safely remote location. These three issued patents are identified as U.S. Pat. Nos. 6,380,906; 6,453,790 and 6,456,240 all of which became known during the year 2002 and all of which are hereby incorporated by reference herein. It is believed helpful in appreciating these three patents as well as the present invention to recognize that the use of moderate power radio frequency communication apparatus in an environment calling for its shock hardening against large physical stresses represents a combination in the technical arts that has remained largely unexplored until recent years. It is possible to attribute this unexplored status to the fact that moderate power radio frequency communications, the use of class "C" nonlinear amplifier stages in such communications and the shock hardening aspects of such apparatus have each been considered to lie in the black art or empirical design arenas and therefore have either been avoided whenever possible or explored in secrecy. Our inventions are believed to represent part of an emergence of this technology.

The occurrence of deceleration forces measuring in the tens of kilo-G or in excess of ten thousand times the force of gravity during a target encounter event i.e., during a probable time of remote study interest, is of course one of the major components of a target encounter environment to be expected in this technology. Another component of this environment is of present interest and concerns a need to limit the temperature excursion incurred in a power semiconductor device employed in communicating data from the moving munitions device to a safely remote location e.g. to limit temperature in a transistor or integrated circuit device included in a telemetry transmitter apparatus embedded in the munitions device. An additional aspect of this environment is the need to limit the physical size and weight of components associated with the invention in order to make them compatible with the space and weight limitations imposed on a ballistic munitions device and the incurred G forces at impact. A yet additional aspect of this environment is the frequent need for a low impedance electrical connection between one or more terminals of a mounted electrical device and a true ground node of the employed electrical circuit.

The present invention is believed to contribute additional knowledge to the art of accomplishing data communication under these unusual environmental conditions and in fact provides a frequently needed component that can be beneficially used in such systems as the communication apparatus described in the incorporated by reference herein patents. The invention is not however limited to use in such environments and may in fact provide utility in other environments including for example routinely encountered static semiconductor device applications.

The present invention therefore addresses the need to mount for example a semiconductor device in order to assure both its physical integrity and its safety from thermal damage during a brief but nevertheless high stress interval of usage. In a situation typical of the presently described military munitions study environment an involved semiconductor device can be for example of the field effect transistor type as is used in the final amplifier stage of a ultra high radio frequency or very high radio frequency transmitter apparatus that receives energization for one quarter of a second during an actual use event extending from before to during an impact of the munitions device with a target. This semiconductor device may also be of the integrated circuit, power diode or other types of semiconductor devices and the invention may in fact also find utility in the mounting of non-semiconductor devices such as power dissipating resistive components and heat dissipating electromechanical devices.

SUMMARY OF THE INVENTION

The present invention provides a thermally effective G-force tolerant, space and weight conserving and low electrical impedance mounting for a semiconductor device or other energy-dissipating component of an electrical apparatus.

It is therefore an object of the present invention to provide an impact resistant mounting for a thermal energy dissipating electrical device.

It is another object of the present invention to provide an impact resistant mounting for a thermal energy dissipating electrical device usable in the space and weight limited environment of a ballistic munitions device.

It is another object of the invention to provide an impact resistant mounting for a thermal energy dissipating electrical device that also enables achievement of a low electrical impedance between the mounted electrical device and a true ground node of an attending electrical circuit.

It is another object of the invention to provide a physically robust mounting for a plastic encapsulated semiconductor device.

It is another object of the invention to provide a mounting arrangement for a semiconductor device that benefits from both heat absorbing and heat dissipating characteristics.

It is another object of the invention to provide a physically robust mounting for a pulse operated semiconductor device, a mounting having thermal capacity to absorb pulse related energy before significant conduction to a dissipating surface can commence.

It is another object of the invention to provide a physically robust mounting for a pulse operated semiconductor device that can in time conduct thermal energy to surrounding conductors such as an array of printed circuit board traces.

It is another object of the invention to provide a physically robust mounting for a pulse operated semiconductor device that achieves physical shock immunity through use of relatively large mounting elements and surfaces.

It is another object of the invention to provide a mounting arrangement for a relatively small semiconductor device of the SO-8 package size.

It is another object of the invention to provide a small semiconductor device mounting arrangement that may be conveniently expanded, possibly in standard size increments, to accommodate larger semiconductor devices.

It is another object of the invention to provide a heat sinking arrangement for a semiconductor device that also provides desirable electrical conductivity for electrical currents originating in said semiconductor device and in physically adjacent electrical circuits.

It is another object of the invention to improve the state of the electrical art with respect to impact resistant radio frequency energy sources of higher operating frequency and moderate operating power capabilities.

It is another object of the invention to provide a semiconductor device mounting arrangement that is readily fabricated from common materials.

It is another object of the invention to provide a semiconductor device mounting arrangement that uses soldering techniques in achieving a combination of thermal conductivity, electrical conductivity and structural integrity.

It is another object of the invention to provide a semiconductor device mounting arrangement that provides both intra surface and inter surface via electrical conductor functions for a printed circuit board.

It is another object of the invention to provide a semiconductor device mounting arrangement that is comparable to a shirt cuff-link in both physical size and in mounting arrangement.

These and other objects of the invention will become apparent as the description of the representative embodiments proceeds.

These and other objects of the invention are achieved by impact resistant semiconductor device mounting and cooling apparatus comprising the combination of:

a printed circuit board having electrical conductors arrayed on first and second surfaces thereof and having a shaped transverse opening located in a selected portion thereof;

an integral metallic heat sink member of first cross section shape conforming with said printed circuit board shaped transverse opening and disposed within in said transverse opening;

said integral metallic heat sink member having a second cross sectional shape orthogonal of said first cross sectional shape and inclusive of a wing element portion extending along said printed circuit board first surface;

said integral metallic heat sink member having a third cross sectional shape orthogonal of both said first cross sectional shape and said second cross sectional shape and including a recessed saddle portion parallel with said printed circuit board along a first cross sectional extremity and a grooved recess parallel with and adjacent said printed circuit board second surface along a second cross sectional extremity.

BRIEF DESCRIPTION OF THE DRAWINGS

The accompanying drawings incorporated in and forming a part of the specification, illustrate several aspects of the present invention and together with the description serve to explain the principles of the invention. In the drawings.

DETAILED DESCRIPTION OF THE INVENTION

Figure 1:
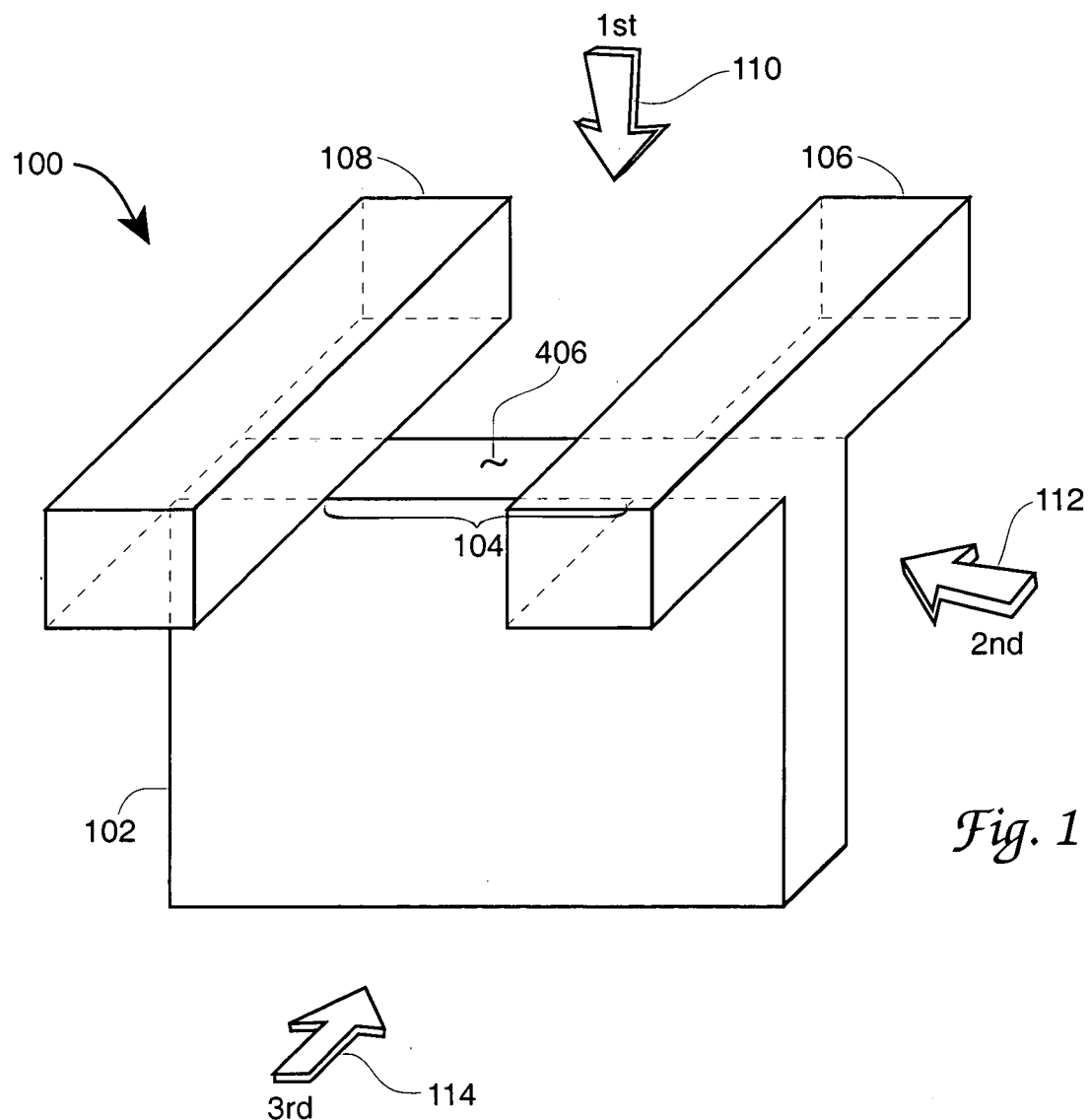
FIG. 1 shows an enlarged perspective view of a miniature heat sink element for a semiconductor mounting arrangement in accordance with the present invention.

FIG. 1 in the drawings shows an enlarged perspective view of a miniature heat sink element 100 of a semiconductor mounting arrangement in accordance with the present invention. As shown in the FIG. 1 drawing the heat sink 100 may be considered to be of a generally Tee shaped cross sectional configuration (as viewed from its FIG. 1 right or left most ends), and to include the tee stem portion 102, the tee stem depth portion or saddle—inclusive portion 104 and the pair of integral transverse wings or tee arms shown at 106 and 108. The FIG. 1 heat sink is preferably composed of gold or copper or some other metal of good thermal and electrical conductivity. Although the metal aluminum is often considered to have such thermal and electrical characteristics, and is indeed a suitable material for some uses of the present invention heat sink, copper or some metal providing desirable soldering characteristics is preferable for incorporating the FIG. 1 heat sink into the circuit assemblies described in the ensuing paragraphs herein and most uses of the invention.

Figure 2:
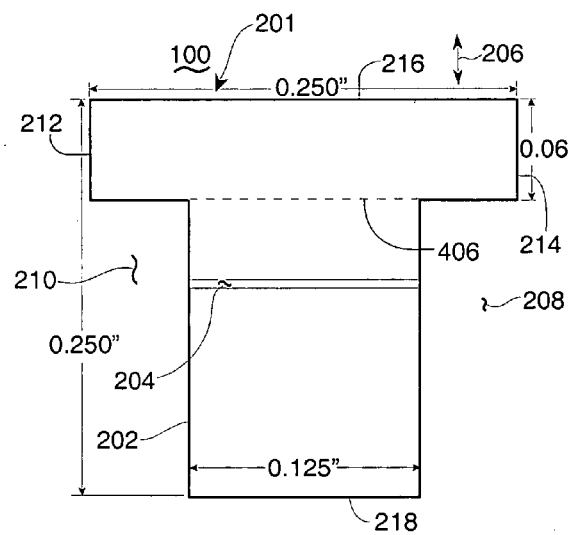
FIG. 2 shows a dimensioned end view of a FIG. 1 heat sink element.

FIG. 2 in the drawings shows an end view of the FIG. 1 heat sink element together with representative or typical dimensions for such a heat sink element as utilized in the pulsed low electrical duty cycle and high impact forces environment described herein. Notably the FIG. 3 heat sink element (herein simply "heat sink") includes a pair of wing-like elements 201 that are received on top of a tee section heat sink tee stem or body element 202 to form a tee-like structure when viewed from an endmost viewpoint. The FIG. 3 heat sink also includes a slot-like cut 204 usable in holding the FIG. 2 structure securely in a printed circuit board in order to achieve an impact-resistant assembly. The preferred direction of the applied impact forces is indicated at 206 in the FIG. 2 drawing, the most preferred direction of this force being in the downward direction of FIG. 2; the FIG. 2 structure is also found to have substantial impact force tolerance in other directions appearing in the FIG. 2 and FIG. 4 drawings.

As indicated by the dimensions appearing in the FIG. 2 drawing the heat sink element of the present invention is typically made to be of a rather small physical size, a size that is actually comparable with for example a naturally occurring individual peanut or cherry pit or shirt cuff-link. This small physical size and the attending relatively small physical mass are of course helpful in limiting the magnitude of the large physical force received by the heat sink during a target impact event, an event such as a smart munitions device encountering a hardened target. In this regard it may be recalled that the force F, generated during a physical deceleration of a moving physical mass M, at a rate A, is predicted by the familiar Newtonian physics mathematical relationship of $F=M \cdot A$ or that the generated force is directly proportional to the amount of mass and its rate of deceleration; the force F in the environment of the present invention is contemplated to be as great as that produced by an acceleration A, of some fourteen thousand (14,000) times the force of gravity.

Figure 3:
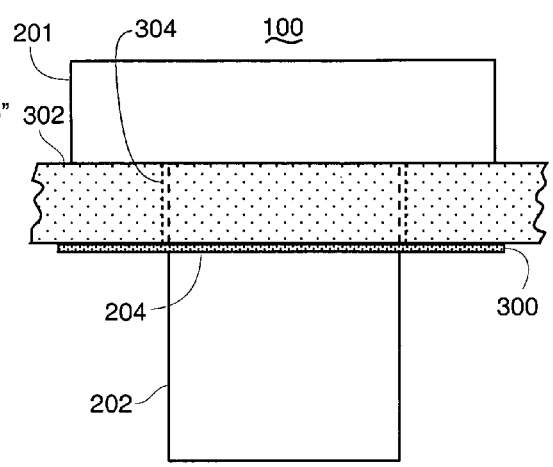
FIG. 3 shows a mounting arrangement for a FIG. 1 and FIG. 2 depicted heat sink element.

Equally important with respect to the present invention the small physical size of the FIG. 1–FIG. 4 heat sink is compatible with the physical size of a family of semiconductor devices that are convenient for use in the electronic circuits embedded in a present day smart munitions device electronic circuits such as a radio frequency energy generating telemetry transmitter or a warhead fuse circuit such as a hard target penetrator fuse. In particular the FIG. 2 and FIG. 3 represented dimensions are compatible with the industry standard eight pin or SO-8 plastic package that is often used to contain a single field effect transistor semiconductor device or a small integrated circuit device. The SO-8 package may for example be conveniently used to contain the 30 watt-rated radio frequency field effect transistors made by Polyfet Devices of Camarillo, Calif. Such transistors have for example proven to be desirable for use in the class "C" final amplifier stage of a 300–500 megahertz telemetry transmitter used in the manner discussed in the above incorporated by reference herein patents in our smart munitions development work. When provided with the heat sink of the present invention this 30 watt transistor is found to be capable of generating a somewhat surprising 42 watt level of radio frequency energy with an overall power in to power out efficiency near seventy percent in the short duty cycle environment characterized by a munitions device telemetry transistor. (A munitions device telemetry transistor can for example be thought of as having an actual in-use operating life measurable in milliseconds of time up to about one quarter of a second; however transmitter tuning and other human interventions often extend the required operating time to at least an integral number of seconds. The heat sink and mounting arrangement of the present invention of course should preferably accommodate the full extent of such duty cycle possibilities.)

Returning now to the description of the present invention heat sink as provided in the FIG. 1 through FIG. 4 drawings, FIG. 3 in these drawings shows how the FIG. 1 and FIG. 2 heat sink 100 may be mounted in a printed circuit board 302 during for example fabrication of the above-described telemetry transmitter. In the FIG. 3 cross sectional view drawing the wing 201 portions of the heat sink 100 are shown to be received on the top most surface of printed circuit board 302 while the body or tee leg portion 202 of the heat sink passes through an aperture 304 of appropriate rectangular configuration that has been pre disposed in the printed circuit board 302. The relationship of the heat sink tee stem portion 202 with the aperture of the printed circuit board 302 may be, for discussion convenience, likened to the relationship of a cuff link with the shirt cuff it retains. As called-for by this analogy the heat sink tee stem 202 passes through the printed circuit board 302 and is retained in this position by an attached but movable orthogonal member engaged within slot 204 and soldered over all possible surfaces.

The printed circuit board 302 may be made to have a thickness of 0.062 inch or 1/16 of an inch and may be made from the fiberglass—resin composite material identified as FR-4/G10 by its many manufacturers and also by Military Specification. This thickness dimension is compatible with and is actually an extension of a convenience concept by which dimensions for the FIG. 1 through FIG. 4 heat sink are assigned in one sixteenth of an inch-compatible measurement units; units that are a number of increments of printed circuit board thickness. Such units are in fact also compatible with the dimensions to be expected in a segment of transmission line of the fifty ohm characteristic impedance "strip line" type. Other measurement units may of course be used with the present invention, including measurements convenient to the metric system when appropriate. The FR4 printed circuit board material is generally said to be usable up to a frequency of some 500 megahertz and is therefore suited to the 300–500 megahertz band of operation of the herein often referred-to telemetry transmitter. For munitions telemetry usage the printed circuit board 302 may have some unusual lateral shape such as the shape of a crescent in order to for example be conveniently fitted into space available in the trailing end portion of a munitions device. A crescent space of some one inch by one inch cross sectional size and radius between five and 14 inches has, for example, been used to contain a telemetry transmitter printed circuit board of this configuration in some of our experimental work.

Also appearing in the FIG. 3 drawing is an end view or cross sectional view of a locking plate or keeper member or flange member 300 used to retain the heat sink 100 captive in the printed circuit board 302. The keeper or flange member 300 preferably engages the slot 204 of the body or tee leg 202 in a manually inserted but snug fit that is ultimately fixed into permanence by a flowing solder attachment to the heat sink 100 as is described in detail in paragraphs following herein. Two of the slots 204 are disposed in the heat sink body 202 as may be best appreciated in the FIG. 4 drawing view. These slots 204 may be cut to 0.025 inch top to bottom dimension in FIG. 3 (to mate with 0.250"×0.500"×0.024" thick copper sheet material keepers) and to a depth of up to 0.030 inch into the heat sink body; desirably such cutting is accomplished by way of a saw cut. Preferably two of the keeper or flange members 300, one at each end of the heat sink body portion 202, are used with the slots 204 in order to retain the heat sink 100 captive in the printed circuit board 302. The slots 204 may of course be extended around the total periphery of the heat sink body 202 and thus engaged by additional keeper or flange members of appropriate length in order to increase the engagement area of the slot or keeper members with the printed circuit board surface and achieve greater impact resistance tolerance when needed.

The keeper or flange members 300 are preferably made of sufficient lateral surface size as to provide the heat sink 100 with a significant capability of resisting impact forces directed upwardly in the FIG. 3 drawing. Soldering of the keepers or flanges 300 as well as the wing-like elements 200 to printed circuit board conductors on each side of the printed circuit board 302 also adds to the impact resistance of the installed heat sink 100 and also to the heat conduction capability of the assembly. The keeper or flange members 300 may be made of the same material such as copper as the heat sink body portion 202 or alternately of some other, preferably solder-capable, material such as brass where greater hardness and resistance to impact force bending is needed.

Figure 4:
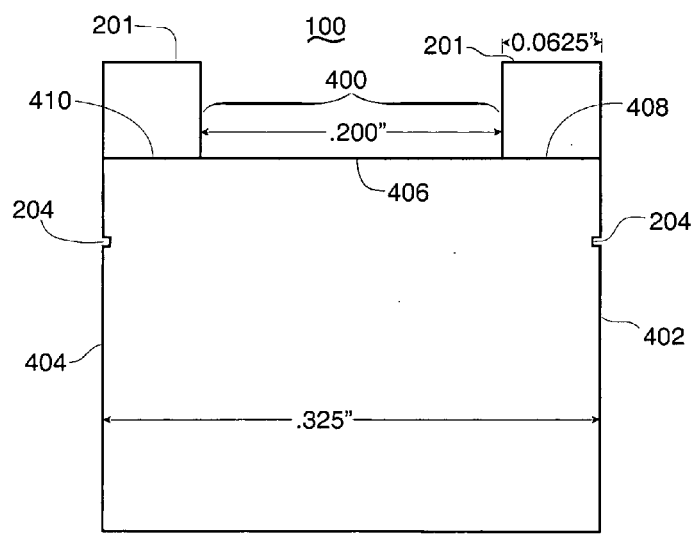
FIG. 4 shows a dimensioned elevation view of a FIG. 1–FIG. 3 heat sink element.

FIG. 4 in the drawings shows a dimensioned elevation view of the FIG. 1 heat sink element 100 as it is tailored to receive a semiconductor device contained in the above-described eight pin SO-8 size package. From the FIG. 4 view it may also be appreciated that the heat sink of the present invention need not be limited to this SO-8 package and may for example be easily extended to the sixteen pin SO-16 package or to other types and other sizes of package, including packages intended for non semiconductor device usage for example. For use with the SO-16 package for example the 0.2 inch saddle width dimension shown in FIG. 4 may be merely doubled to 0.40 inch and the overall width shown in FIG. 4 increased to 0.525 inch. Again other dimensions are entirely possible when attended by accommodation of the resulting changes in heat sink mass, thermal conductivity and other characteristics.

The wings 201 used to retain the heat sink 100 on the top surface of printed circuit board 302 in the FIG. 3 drawing appear at the upper right and left in the FIG. 3 view. The wing dimensions as shown in FIG. 2 are compatible with the printed circuit board thickness dimension 0.062 inch units of measure already described herein. When made in accordance with these dimensions the heat sink tee leg portion lies ⅓ within the printed circuit board 302 in the FIG. 3 drawing and ⅔ extending below the printed circuit board. For space and mass conservation purposes it may be desirable to limit the extent of this ⅔ extension by either pre assembly or post assembly shortening of the tee leg portion. Similarly shortening may be applied to the wing dimensions shown in FIG. 2 where mass and size limitations are imposed and sufficient surface area contact remains with the printed circuit board to dissipate the encountered impact force. The overall heat sink depth dimension of 0.325 inch shown in the FIG. 4 drawing is also compatible with the 0.062 inch unit of measure arrangement and is selected in accordance with the SO-8 device package size usage of the illustrated heat sink.

The space intermediate the wings 201 in the FIG. 4 drawing, i.e., the space 400 where the semiconductor device package is received, may be referred-to as the heat sink saddle area and is arranged to provide the lowest possible thermal resistance between a mounted semiconductor device and its ultimate thermal energy dissipation media. This lowest possible thermal resistance is achieved by way of the substantial surface area available in the saddle region area 400 for receiving heat from the semiconductor device and the contemplated low thermal resistance connection established in the saddle area with the semiconductor device i.e., the connection established at the surface 406 in FIG. 4. Although silicone paste based heat conducting media as commonly used in the electronics industry may be used in the saddle area 400 to make an effective thermal connection with a semiconductor device the completely metal connection described below herein is preferred because of its lower thermal resistance. Indeed many of the characteristics of the present invention heat sink are arranged in contemplation of this all-metal connection.

Figure 5:
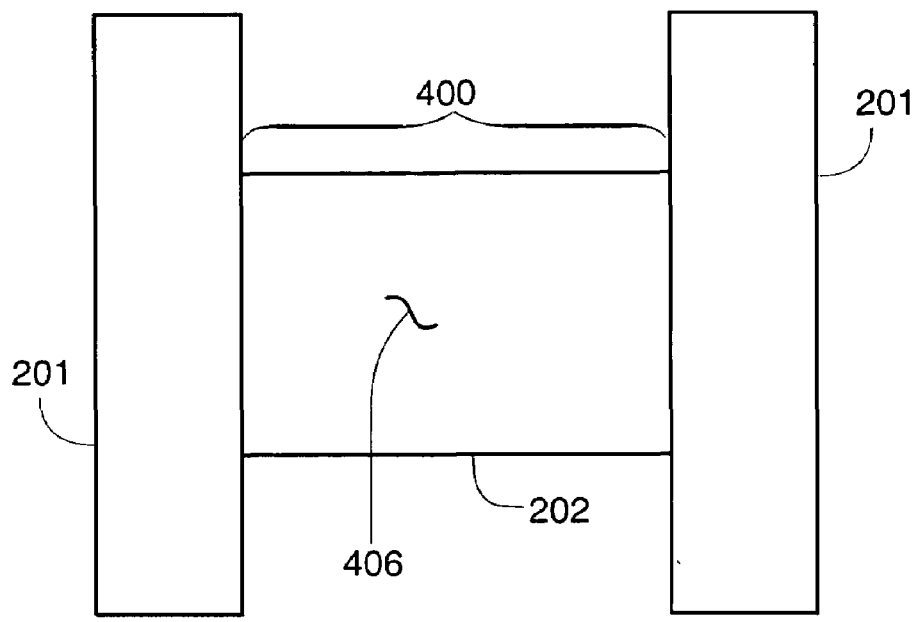
FIG. 5 shows a top view of a FIG. 1–FIG. 4 heat sink element.

The substantial cross sectional area of the wings 201 and the resulting ability of these elements to conduct heat away from the saddle area 400 may be appreciated in both the FIG. 4 and FIG. 5 drawings. This substantial wing cross sectional area of course also contributes to the thermal mass of the heat sink 100 and is thereby of significant temperature limiting benefit in the short duration or pulse operated environment of the munitions device telemetry function contemplated in the referred-to application of the present invention heat sink. The substantial wing cross sectional area also is effective to communicate saddle area heat to the copper or other conductor material located on the upper surface of the printed circuit board 304—especially in view of the preferred use of solder between the lower wing surface and the printed circuit board conductor. A top view of the saddle area 400 of a present invention heat sink and the adjoining wings 201 appears in the FIG. 5 drawing. The lines appearing at 408 and 410 in FIG. 4 may at first blush appear to be portions of or extensions of the saddle area 400 and the saddle surface 406. Actually however these lines 406 and 408 represent the intersection of the lower surface of the wings 201 with the heat sink body portion 202 and thus merely happen to coincide with the elevation of the saddle surface 406 in the illustrated embodiment of the invention.

Figure 6:
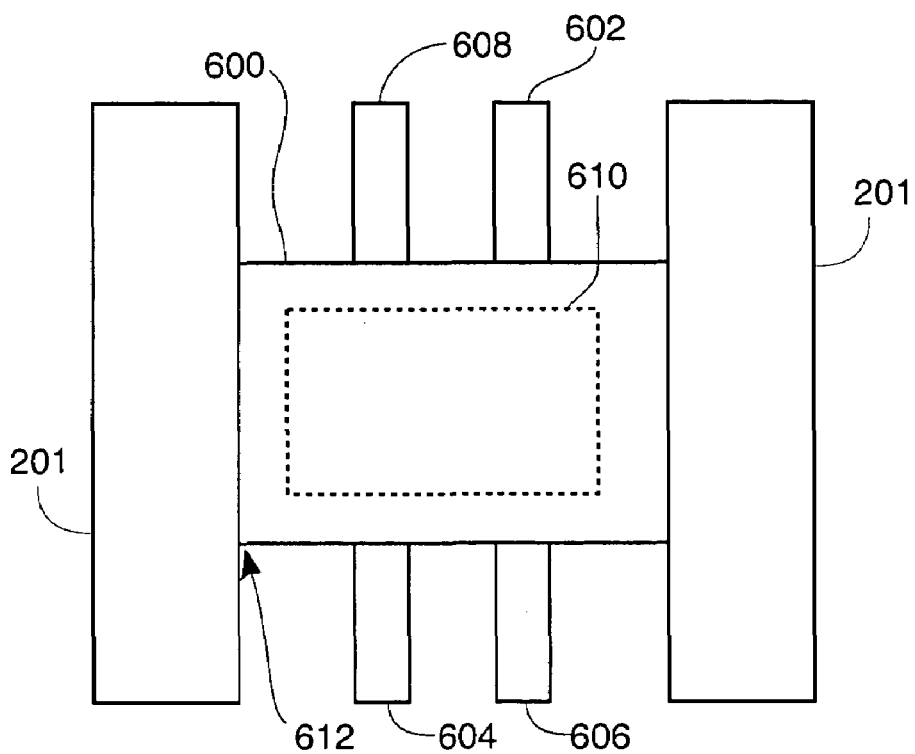
FIG. 6 shows a top view of a FIG. 1–FIG. 5 heat sink element with a mounted semiconductor device received thereon.

A top view of a packaged semiconductor device 600 mounted in the saddle area 400 of a present invention heat sink appears in the FIG. 6 drawing. Also appearing in the FIG. 6 drawing are the leads 602, 604 606 and 608 by which the semiconductor device 600 is later to be electrically interconnected with other elements of a telemetry transmitter or other circuit utilizing the present invention heat sink. In the case of a single transistor being contained in the saddle 400-mounted semiconductor device, one pair of leads such as leads 604 and 606 on each side of the semiconductor device 600 may be commonly connected both within and external of the semiconductor device 600. Actually SO-8 transistor packages normally include four leads on each side of the transistor package however in the case of one transistor used with the present invention heat sink, four of the resulting leads are also common to the transistor source electrode and the metal window area of the SO-8 package described in ensuing paragraphs herein and therefore may be removed before transistor mounting. Notably the direct connection of a transistor source element to the metal of the window area 610 as espoused herein, in addition to providing a good thermal path for transistor heat also provides a desirably low electrical inductance path for the transistor's source current to follow. Passing such current through the inductance of bond wires normally disposed within a transistor package can be quite detrimental to the operation of a transistor amplifier functioning in the 300–500 megahertz frequency region.

Before departing from the saddle area 400 and its containment of the mounted semiconductor device 600 it is also desirable to consider that the arm or wing elements 201 as shown in the FIG. 6 drawing provide additional support and stabilization for the semiconductor device 600 in the saddle 400 by way of the physical abutment occurring at 612 and the other similar locations in FIG. 6. By way of this physical abutment the semiconductor device 600 is restrained from motion in at least one direction even though the shock and shock excited vibration arising from a target impact event may be sufficient to stretch the metal located within the window area 610 or otherwise establish vibrations in the semiconductor device, the printed circuit board and the heat sink structures. This physical abutment restraint is usually solder filled, but may be assisted by adding other suitable filler materials such as an organic sealer or a hardenable substance such as an epoxy between the semiconductor device surface and the adjacent surface of the arm or wing elements 201.

The heretofore discussed drawings of FIG. 3, FIG. 4 and FIG. 6 may also be though of as representing three different cross sectional views of the present invention heat sink, three cross sectional views that are each oriented mutually orthogonal with respect to the remaining two views of the heat sink. Cross sectional shading is omitted in all but the FIG. 3 of these potential cross sectional views for convenience and clarity purposes. The arrows at 110, 112 and 114 in the FIG. 1 drawing show directions of viewing that are appropriate for these three different cross sectional views and are identified with one possible set of cross sectional view identification numbers. Other cross sectional view identification number ordering may of course be assigned as desired. A cross sectional interpretation of the FIG. 3, FIG. 4 and FIG. 6 drawings is believed helpful in understanding the formal description language relating to the invention included in the attached claims.

The enclosed dotted line window area at 610 in the FIG. 6 drawing of a SO-8 package-contained semiconductor device represents the outline of a lower face exposure metal panel window of the semiconductor device 600. In some transistor types such as in the Lateral Drain Metal Oxide Silicon (LDMOS) transistor this metal window is in fact physically and electrically connected with one transistor element, such as the transistor source element, of a transistor received in the saddle-mounted device package 600 (i.e., the transistor layers are fabricated on the top surface of the metal window area 610 with for example the transistor source electrode being both formed on and connected with the window metal; package enclosure material is added to the transistor after this fabrication). This transistor fabrication arrangement enables the transistor within the dotted line 610 to be intimately connected electrically and thermally with the transistor package window metal. Notably such intimate connection also continues into the saddle area in the present invention heat sink and moreover allows for the transistor metal to heat sink connection to be accomplished by way of metallic soldering—in order to obtain the lowest possible thermal resistance in the transistor heat dissipation path. A metal to metal connection, even when accomplished by way of tin/lead solder, is of course far superior to an insulated connection (as often accomplished with a mica washer and silicone grease for example) in its low thermal resistance and heat transferring ability.

Fabrication of transistor layers on the top surface of the window area defined by the dotted line 610 and direct connection of this window area to the heat sink 100 also of course provides the desired lowest possible electrical resistance and electrical impedance between a transistor electrode and the true ground node of the electrical circuit utilizing the transistor. The direct soldering connection of a metal transistor fabrication substrate to the heat sink of the present invention of course entails heating of the semiconductor layers of the transistor to solder flow-promoting temperatures for at least the short interval of a soldering event. The resulting semiconductor device temperatures, temperatures in the 500 to 600 degrees Fahrenheit or 260 to 315 degrees Centigrade range when eutectic-proximate tin/lead solder is used, appear to be satisfactorily tolerated by at least silicon semiconductor devices. Semiconductor devices made from gallium arsenide and germanium and other semiconductor materials may be threatened by temperatures of this range and thereby may call for the use of threaded fasteners or thermally conductive adhesives or other lower temperature attachment arrangements at the semiconductor device to heat sink interface in the present invention.

Soldering may be used to electrically connect the wings 201 of the FIG. 1 and FIG. 2 heat sink 102 into the topside printed circuit board electrical circuit and thus enables use of the wings 201 as printed circuit board surface mounted conductors, i.e., as conductors communicating between other topside conductors of the printed circuit board or topside to bottom side communication conductors. This heat sink conductor concept thus enables the tee stem body 202 of the heat sink to communicate electrical currents and thermal energy through the printed circuit board 302. The electrical conduction of these conductive attributes in fact represents a significant attribute of the present invention, i.e., such conduction may be attributed to the general principle that the present invention heat sink adds significant via conductor capability to a printed circuit board in which it is installed. This via conductor ability may especially be observed, by way of the large cross sectional areas involved, to be significantly more effective than the usual plated through or otherwise arranged circular via holes in connecting front side printed circuit board conductors with backside conductors. Good via conductors are of course of significant assistance in obtaining the desired performance from a circuit operating in the presently considered 300–500 megahertz frequency band. As has been stated in one corollary to the familiar Murphy's law, nothing is so effective in turning an amplifier circuit into an oscillator circuit as a small amount of inductance in a ground path.

Fabrication of the FIG. 1 heat sink element 100 in the present semiconductor device mounting arrangement invention may be accomplished through use of an individual molding or casting sequence that is tailored for the preferred copper or copper inclusive material. Other materials such as brass or possibly aluminum may also be used for the heat sink and fabricated by these processes. Aluminum is however difficult or impossible to solder using at least conventional tin/lead processes and the electrical and thermal conductivity of both brass and aluminum is somewhat lower than that of the preferred copper metal. In addition use of such molding or casting processes can result in metal grain structures characterized by lower thermal and electrical conductivity than is achieved with other fabrication arrangements and can result in exterior heat sink surfaces that are sufficiently rough as to require smoothing for achieving effective thermal and electrical contact with a semiconductor device package. In view of these limitations therefore the preferred arrangement for fabrication of at least small quantities of the FIG. 1 heat sink is through use of machining commenced with conventional rolled soft copper bar stock.

During such individual heat sink element machining it is possible to commence with a billet or blank or having the overall 0.25 by 0.25 by 0.325 inch dimensions shown in the FIG. 2 and FIG. 4 drawings and to then perform milling machine or other machine-tool cutting operations to remove metal from the areas 208 and 210 identified in the FIG. 2 drawing and from the saddle region 400 defined in the FIG. 4 drawing. Alternately it is also possible to commence fabrication of the heat sink 100 with a length of bar stock. Such stock may be first machined and then severed into individual heat sink element lengths or severed first and then machined to achieve the illustrated shapes. Notably a simple straight three-cut or four-cut straight line machining sequence is sufficient to achieve FIG. 1 represented shape using this individual heat sink element machine tool fabrication process. Moreover at least two of these machine cuts can be performed on a multiple heat sink blank wherein the individual heat sink elements are taken from the blank by segregation of adjacent heat sink surfaces 402 and 404 as are shown in the FIG. 4 drawing. A small milling machine such as a computer-controlled machine is convenient in performing these machining steps. In view of the well known chip-reattachment properties and chip pile difficulties encountered in machining metallic copper stock it is well to include a degree of patience or hesitation in the heat sink machining operations.

It is also feasible to machine the FIG. 1 heat sink elements from a multi element blank or billet in which the individual heat sink elements are originally adjacent at the surfaces 212 and 214 in the FIG. 2 drawing—through use of a sawing or other cutting segregation procedure. Machining in this manner enables single cut formation of the slot like cuts 204 and the saddle regions 400 in a plurality of heat sink elements. Additionally it is of course also possible to machine the FIG. 1 heat sink elements from a multi element blank or billet in which the individual heat sink elements are originally adjacent at the surfaces 216 and 218 in the FIG. 2 drawing—by use of another sawing or cutting segregation sequence. As may be observed from this number of fabrication possibilities the optimum method of fabrication is perhaps best defined by available equipment rather than by limitations of the fabricated heat sink.

The relatively small size and mass of the present invention heat sink element also lends to the use of a screw machine or punch press die fabrication process to meet larger quantity heat sink needs. Rearrangement of the described configuration of the heat sink can make use of such equipment easier while maintaining the underlying function of the device.

The significance of a well considered heat sink in critical electrical circuitry, such as in many moderate power radio frequency circuits, may perhaps be better appreciated by recognizing that some of the large semiconductor manufacturers have recently adopted the practice of selling their moderate and large power radio frequency semiconductor devices with a factory installed heat sink already mounted in place. Although this practice limits a user's freedom to employ the semiconductor device in unusual physical arrangements it has doubtless been found helpful in assuring the achievement of adequate cooling and limiting heat-associated semiconductor device problems. The large and fixed shape of such semiconductor device plus heat sink combinations almost universally prohibits their use in our munitions related work; especially when the impact loading forces of our environment are considered. This is perhaps another illustration in support of our belief that the combination of impact loading and moderate radio frequency power in a single electrical circuit is a specialized area that has received little attention in the electronic art.

The present semiconductor device mounting invention is therefore believed to improve the art of impact hardened and moderate radio frequency energy electrical circuits; some of the more significant advantages provided by the invention may be summarized as follows.

Downward movement of the mounted semiconductor device is restricted by wing-bars received on top of the receiving printed circuit board;

Upward movement of the mounted semiconductor device is restricted by plates received in semiconductor body slots;

Bars and interlocking plates are soldered to an available 2-side plated printed circuit board;

Heat transfer is above, through and below the preferably copper printed circuit board Low inductance grounding is above, through and below the preferably copper printed circuit board;

Certain transistors such as LDMOS devices have the source element soldered-in a heat sink saddle area by way of a metal window located at the bottom of selected plastic packages.

The heat sink retaining bars and plates are disposed at package ends and do not interfere with transistor heat sink center (source) and side-located (gate and drain) leads.

The invention is believed to make a needed contribution to the art of relatively high powered semiconductor devices that must operate in a physically stressful and significant impact inclusive environment.

The foregoing description of the preferred embodiment has been presented for purposes of illustration and description. It is not intended to be exhaustive nor to limit the invention to the precise form disclosed. Obvious modifications or variations are possible in light of the above teachings. The embodiment has been chosen and described to provide the best illustration of the principles of the invention and its practical application in order to thereby enable one of ordinary skill in the art to utilize the invention in various embodiments and with various modifications as are suited to the particular scope of the invention as determined by the appended claims when interpreted in accordance with the breadth to which they are fairly, legally and equitably entitled.

I claim:

1. Physical shock hardened heat sink inclusive semiconductor device mounting comprising the combination of:
a physical shock resistant printed circuit board composed of electrical insulating material and including on at least a first surface thereof an array of metallic film electrical conductors;
a metallic heat sink member having a T stem body portion extending in transverse relationship with an aperture opening of said printed circuit board;
said metallic heat sink member including integral T arm portions located at a T stem extremity and extending along and beyond said T stem body portion in intimate proximity with first surface portions of said printed circuit board;
said metallic heat sink member also including a semiconductor device reception area saddle region located intermediate said first and second pairs of integral T arm portions on said metallic heat sink member; and
said heat sink T stem body portion including a T stem body portion slot member in alignment with a second surface of said printed circuit board and enabling a keeper member retention of said printed circuit board in captured engagement with a T arm portion during a physical shock event.

2. The physical shock hardened heat sink inclusive semiconductor device apparatus of claim 1 wherein said metallic film electrical conductors and said T cross-sectioned heat sink metallic body member are comprised of metallic copper.

3. The physical shock hardened heat sink inclusive semiconductor device apparatus of claim 2 wherein said T cross-sectioned heat sink metallic body member T arm portions are connected by tin/lead solder with selected portions of said printed circuit board surface array of metallic film electrical conductors.

4. The physical shock hardened heat sink inclusive semiconductor device apparatus of claim 2 wherein said printed circuit board includes a second array of metallic film electrical conductors on a second surface thereof and wherein said T stem body element keeper member includes a tin/lead solder interface connection with said second array of metallic film electrical conductors on said second printed circuit board surface.

5. The physical shock hardened heat sink inclusive semiconductor device apparatus of claim 1 wherein said first and second of said T arm portions are of rectangular cross section.

6. The physical shock hardened heat sink inclusive semiconductor device apparatus of claim 1 further including a semiconductor device received in intimate thermal contact with said heat sink metallic body member saddle region.

7. The physical shock hardened heat sink inclusive semiconductor device apparatus of claim 6 wherein said semiconductor device intimate thermal contact includes a solder interface connection with a saddle region portion of said heat sink.

8. The physical shock hardened heat sink inclusive semiconductor device apparatus of claim 6 wherein said semiconductor device intimate thermal contact includes a thermally conductive silicone material interface connection with said saddle region portion of said heat sink.

9. The physical shock hardened heat sink inclusive semiconductor device apparatus of claim 1 further including a second T stem body element slot member and a second T stem body element slot member-engaged keeper member disposed along a second surface of said printed circuit board and additionally holding said printed circuit board in captured engagement between said T arm portions and a slot member-engaged keeper member.

10. The physical shock hardened heat sink inclusive semiconductor device apparatus of claim 1 wherein said heat sink metallic body member saddle region semiconductor device reception area is disposed in a coplanar flush relationship with said printed circuit board first surface.

11. The high G-force physical impact tolerant, high thermal conductivity and low electrical inductance method of mounting semiconductor device and heat sink comprising the steps of:

disposing said semiconductor device in a solidified liquid interface inclusive intimate physical, thermal, and electrical contact with a metallic heat sink element of selected thermal and electrical conductivity characteristics;

said disposing step also including locating said semiconductor device in high G-force physical impact tolerant unidirectional physical restraint intermediate integral structural portions of said metallic heat sink element;

suspending said metallic heat sink element and said semiconductor device in captive confinement within an aperture of an electrically insulating high G-force physical impact tolerant printed circuit board;

retaining said metallic heat sink element within said aperture of said electrically insulating high G-force physical impact tolerant printed circuit board using metallic heat sink-connected metallic wing elements spreading across lateral surface portions of said printed circuit board adjacent said aperture; and bonding selected portions of one of said metallic heat sink element and said metallic heat sink-connected metallic wing elements with adjacent electrically and thermally conductive film wiring conductors located on a surface of said printed circuit board.

12. The high G-force physical impact tolerant, high thermal conductivity and low electrical inductance method of mounting a semiconductor device and heat sink of claim 11 wherein said disposing step and said bonding step each include a soldering with tin/lead solder step.

13. The high G-force physical impact tolerant, high thermal conductivity and low electrical inductance method of mounting a semiconductor device and heat sink of claim 12 wherein said step of bonding selected portions of one of said metallic heat sink element and said metallic heat sink-connected metallic wing elements with adjacent electrically and thermally conductive film wiring conductors located on a surface of said printed circuit board includes bonding selected portions of each of said metallic heat sink element and said metallic heat sink-connected metallic wing elements with adjacent electrically and thermally conductive film wiring conductors located on each surface of said printed circuit board.

14. The high G-force physical impact tolerant, high thermal conductivity and low electrical inductance method of mounting a semiconductor device and heat sink of claim 13 wherein said bonded selected portions of each of said metallic heat sink element comprise heat sink-integral wing elements.

15. The high G-force physical impact tolerant, high thermal conductivity and low electrical inductance method of mounting a semiconductor device and heat sink of claim 11 wherein one of said disposing step and said bonding step include application of a hardenable liquid organic material.

16. Impact resistant semiconductor device mounting and cooling apparatus comprising the combination of:

a printed circuit board having electrical conductors arrayed on first and second surfaces thereof and having a shaped transverse opening located in a selected portion thereof;

an integral metallic heat sink member of first cross section shape conforming with said printed circuit board shaped transverse opening and disposed within said transverse opening;

said integral metallic heat sink member having a second cross sectional shape orthogonal to of said first cross sectional shape and inclusive of a wing element portion extending along said printed circuit board first surface; and said integral metallic heat sink member having a third cross sectional shape orthogonal to both said first cross sectional shape and said second cross sectional shape and including a recessed saddle portion parallel with said printed circuit board along a first cross sectional extremity and a grooved recess parallel with and adjacent said printed circuit board second surface along a second cross sectional extremity.

17. The impact resistant semiconductor device mounting and cooling apparatus of claim 16 wherein said first cross sectional shape also includes said second cross sectional shape wing members.

18. The impact resistant semiconductor device mounting and cooling apparatus of claim 16 wherein said integral metallic heat sink member third cross sectional shape recessed saddle portion and said printed circuit board first surface electrical conductors are disposed in substantially coplanar elevation.

19. The impact resistant semiconductor device mounting and cooling apparatus of claim 16 further including a second grooved recess parallel with and adjacent said printed circuit board second surface and received in a third extremity of said third cross sectional shape.

20. The impact resistant semiconductor device mounting and cooling apparatus of claim 19 further including a first and second metallic keeper members engaged with said first and second grooved recesses and capturing said printed circuit board intermediate said first cross sectional shape wing element portion and said first and second metallic keeper members.

21. The impact resistant semiconductor device mounting and cooling apparatus of claim 20 wherein said first and second metallic keeper members and said first cross sectional shape wing element portion are engaged with said printed circuit board first and second surface electrical conductors by tin/lead solder.

22. The impact resistant semiconductor device mounting and cooling apparatus of claim 16 wherein said integral metallic heat sink member also comprises an electrical current conducting portion of said printed circuit board first and second surface electrical conductors.

23. The impact resistant semiconductor device mounting and cooling apparatus of claim 16 wherein said metallic heat sink member third cross sectional shape recessed saddle portion is disposed in a coplanar relationship with a topside surface of said printed circuit board and wherein a metal window portion of a heat sink-mounted semiconductor device is soldered to said saddle portion with circuit leads of said semiconductor device overhanging said saddle portion and engaging topside circuit conductors of said printed circuit board.

* * * * *